United States Patent
Iwamoto (10) Patent No.: US 9,935,093 B2
(45) Date of Patent: Apr. 3, 2018

(54) SEMICONDUCTOR ELEMENT AND SEMICONDUCTOR DEVICE

(71) Applicant: LAPIS SEMICONDUCTOR CO., LTD., Kanagawa (JP)

(72) Inventor: Kazushige Iwamoto, Kanagawa (JP)

(73) Assignee: LAPIS SEMICONDUCTOR CO., LTD., Kanagawa (JP)

(*) Notice: Subject to any disclaimer, the term of this patent is extended or adjusted under 35 U.S.C. 154(b) by 0 days.

(21) Appl. No.: 14/807,954

(22) Filed: Jul. 24, 2015

(65) Prior Publication Data

US 2016/0035713 A1 Feb. 4, 2016

(30) Foreign Application Priority Data

Aug. 1, 2014 (JP) ................................. 2014-157588

(51) Int. Cl.
| | | |
|---|---|---|
| H01L 21/70 | (2006.01) | |
| H01L 27/02 | (2006.01) | |
| H01L 23/60 | (2006.01) | |
| H01L 29/06 | (2006.01) | |
| H01L 29/36 | (2006.01) | |

(52) U.S. Cl.
CPC .......... *H01L 27/0207* (2013.01); *H01L 23/60* (2013.01); *H01L 27/0255* (2013.01); *H01L 27/0292* (2013.01); *H01L 29/0649* (2013.01); *H01L 29/0684* (2013.01); *H01L 29/0692* (2013.01); *H01L 29/36* (2013.01); *H01L 2924/0002* (2013.01)

(58) Field of Classification Search
CPC . H01L 27/0207; H01L 23/60; H01L 27/0292; H01L 29/36; H01L 29/0692; H01L 29/0684; H01L 29/0649; H01L 27/0255; H01L 2924/0002
See application file for complete search history.

(56) References Cited

U.S. PATENT DOCUMENTS

| | | | |
|---|---|---|---|
| 5,744,826 A * | 4/1998 | Takeuchi | ............ H01L 29/7828 257/328 |
| 9,318,482 B2 * | 4/2016 | Yoo | ...................... H01L 27/0288 |
| 2002/0014904 A1 | 2/2002 | Morishita | |

(Continued)

FOREIGN PATENT DOCUMENTS

| | | |
|---|---|---|
| JP | H05-029636 A | 5/1993 |
| JP | H08-181334 A | 7/1996 |

OTHER PUBLICATIONS

Office Action for Japanese Patent Application No. 2014-157588, dated Dec. 19, 2017 by Japan Patent Office (JPO).

*Primary Examiner* — Thanh Y Tran
(74) *Attorney, Agent, or Firm* — Kubotera & Associates, LLC (57) ABSTRACT

A semiconductor device includes a voltage generation circuit configured to generate a specific voltage; a first terminal configured to output the specific voltage; a second terminal configured to receive a temperature sensitive voltage; an analog/digital conversion circuit configured to convert the specific voltage and the temperature sensitive voltage to digital values; a storage unit configured to store the specific voltage and the temperature sensitive voltage; and a third terminal configured to transmit the specific voltage and the temperature sensitive voltage to an external semiconductor device.

8 Claims, 7 Drawing Sheets

(56) References Cited

U.S. PATENT DOCUMENTS

2006/0006490 A1    1/2006   Doi
2016/0064375 A1*   3/2016   Yoo .................... H01L 27/0288
                                                                                                              257/491

\* cited by examiner

SEMICONDUCTOR ELEMENT AND SEMICONDUCTOR DEVICE

BACKGROUND OF THE INVENTION AND RELATED ART STATEMENT

The present invention relates to a semiconductor element and a semiconductor device. In particular, the present invention relates to a semiconductor element having a specific configuration and a semiconductor device including the semiconductor element.

In a conventional semiconductor device including a conventional semiconductor element, there is a time when it is necessary to increase an allowable limit of an electrical current (an allowable electrical current) to be flown in the semiconductor element. As an example of such a conventional semiconductor device includes an electro-static discharge (ESD) protection circuit that protect an electrical circuitry from an electro-static discharge (ESD). In general, the ESD protection circuit is formed of a diode. The ESD circuit may be designed to increase the allowable electrical current to be flow through the diode (a p-n connection), so that it is possible to discharge a surge electrical current with a high peak value outside the conventional semiconductor device.

Figure 5:
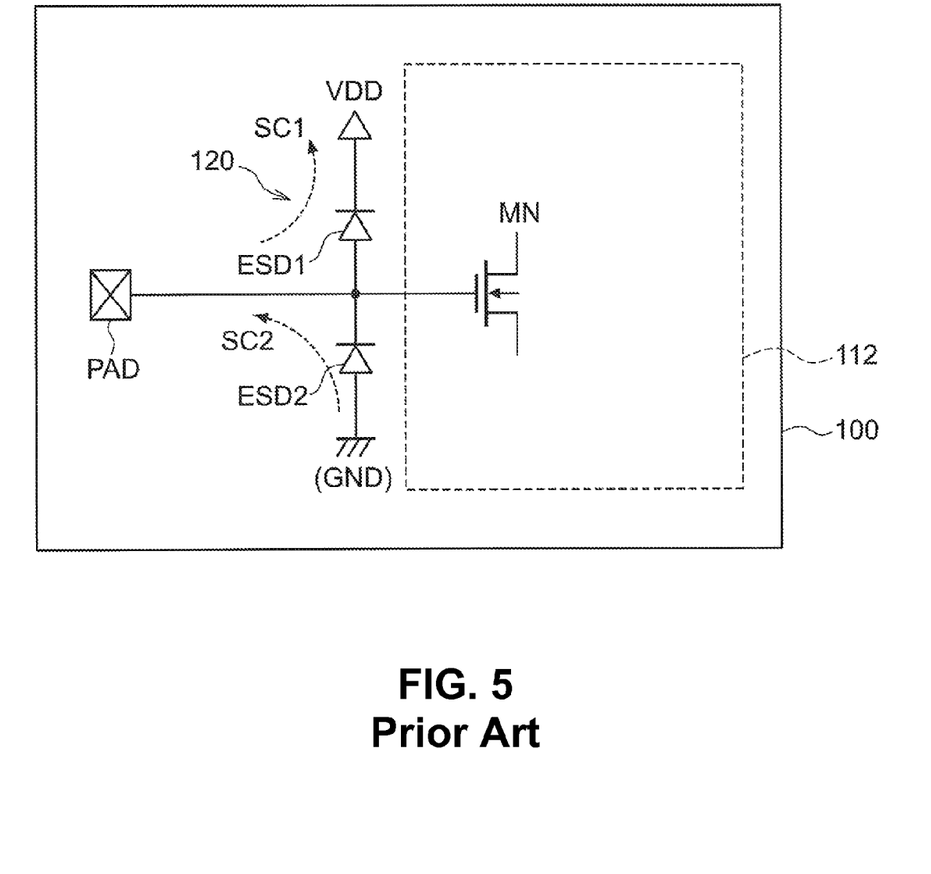
FIG. 5 is a circuit diagram showing a configuration of a static electricity protection circuit as a conventional semiconductor device.

FIG. 5 is a circuit diagram showing a configuration of an ESD protection circuit 120 disposed in a semiconductor integrated circuit 100 as the conventional semiconductor device.

As shown in FIG. 5, the ESD protection circuit 120 is composed of static electricity protection elements ESD1 and ESD2 using diodes. More specifically, the static electricity protection element ESD1 is connected between an input terminal PAD and a positive power source VDD, and the static electricity protection element ESD2 is connected between the input terminal PAS and ground (GND), respectively. Further, the input terminal PAD is connected to an inner circuit 112 of the semiconductor integrated circuit 100. More specifically, the input terminal PAD is connected to a transistor MN of the inner circuit 112 as shown in FIG. 5. It should be noted that, in addition to the input terminal PAD, the ESD protection circuit 120 may disposed at a location necessary for the static electricity protection such as an output terminal, a power source wiring, and the like.

Patent Reference has disclosed a static electricity protection element composed of a diode having a rectangular shape, and a size of the diode is determined based on the allowable static electricity (the allowable ESD). For example, when it is necessary to achieve the allowable ESD of 2,000 V according to a human body model method (HBM method), the diode needs to have a size that is not damaged when an electrical current of 1.33 A flows through the diode according to the TDR-TLP measurement method.

In the HBM method, the allowable static electricity is measured in a discharge model that a human body contacts with a semiconductor. Further, in the TDR-TLP measurement method, a rectangular wave is applied to a measurement subject. Then, an oscilloscope is used to observe and analyze a reflection wave from the measurement subject, so that an operational characteristic of the measurement subject upon applying the ESD.

Patent Reference: Japanese Patent Publication No. 08-181334

In general, it has been known that the allowable electrical current passing through the diode is proportional to a length of a p-type region facing an n-type region in the diode (that is, a length of a portion of the diode functioning as the p-n connection, also referred to as a circumferential length in the following description). For example, it is assumed that, when the diode has the circumferential length of 10 μm, the diode has the allowable electrical current of 0.1 A. In order for the diode to have the allowable electrical current of 1.33 A, it is necessary for the diode to have the circumferential length of 133 μm (=10 μm×(1.33 A/0.1 A)).

More specifically, with the diode disclosed in Patent Reference as an example, the circumferential length will be explained in more detail. According to Patent Reference, the static electricity protection element is composed of a diode 200, that is, a Zener diode, as the static electricity protection element.

Figure 6:
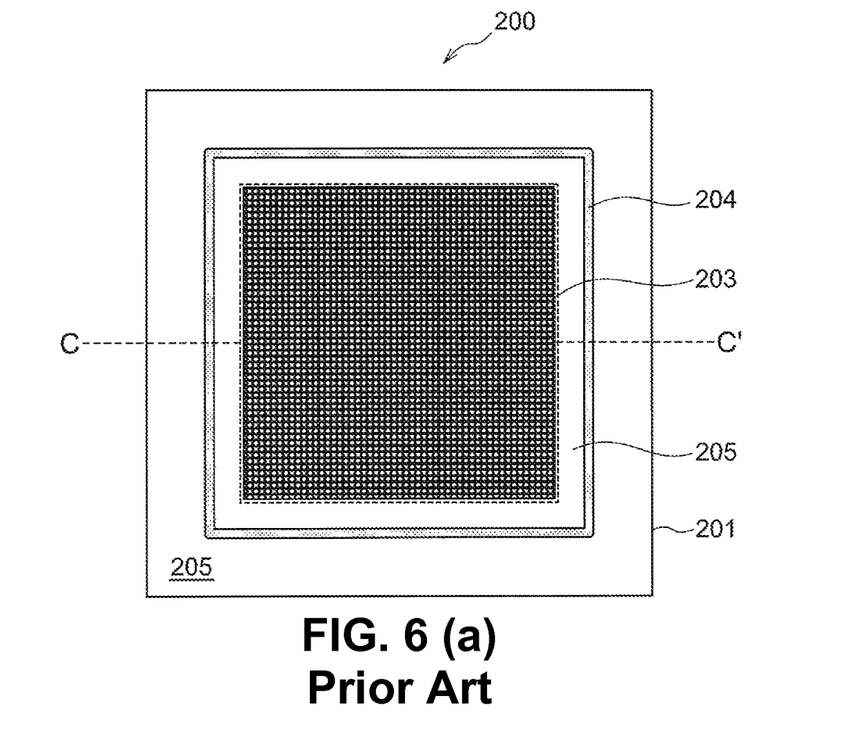
FIG. 6(a) is a schematic plan view showing the conventional semiconductor element.
FIG. 6(b) is a schematic sectional view showing the conventional semiconductor element taken along a line C-C' in FIG. 6(a).

FIGS. 6(a) and 6(b) are schematic views showing a configuration of the diode 200 as the static electricity protection element. More specifically, FIG. 6(a) is a schematic plan view showing the diode 200, and FIG. 6(b) is a schematic sectional view showing the diode 200 taken along a line C-C' in FIG. 6(a).

As shown in FIGS. 6(a) and 6(b), the diode 200 includes a P-type substrate 201; an N-type well 202 formed in the P-type substrate; and a P-type high concentration diffusion layer 203 and an N-type high concentration diffusion layer 204 formed in the N-type well 202. Further, the P-type high concentration diffusion layer 203 is separated from the N-type high concentration diffusion layer 204 with an element separation oxide film 205 in between. The P-type high concentration diffusion layer 203 is formed in a rectangular shape, and the N-type high concentration diffusion layer 204 is formed in a ring shape surrounding a circumference of the P-type high concentration diffusion layer 203 formed in a rectangular shape.

In the static electricity protection element disclosed in Patent Reference, as one of methods of defining the circumferential length, the circumferential length of the diode 200 may be defined as a length of an outer circumference of the P-type high concentration diffusion layer 203 formed in a rectangular shape (represented with a hidden line in FIG. 6(a)). According to this definition, in order for the diode 200 to have the allowable electrical current of 1.33 A, it is necessary for the P-type high concentration diffusion layer 203 to have the circumferential length of 133 μm.

As described above, the allowable electrical current of the diode is determined by the circumferential length. Further, in order to reduce the size of the semiconductor device, it is necessary to reduce the size of the diode as much as possible. Accordingly, when it is necessary to increase the allowable electrical current of the diode, especially the diode as the static electricity protection element, it is necessary to increase the circumferential length thereof as much as possible while restricting the size of the diode as a whole.

As described above, the static electricity protection element disclosed in Patent Reference, the P-type high concentration diffusion layer 203 is formed in a rectangular shape (or an island shape), and the N-type high concentration diffusion layer 204 is formed in a ring shape surrounding the circumference of the P-type high concentration diffusion layer 203 formed in a rectangular shape. Accordingly, it is difficult to reduce the circumferential length of the N-type high concentration diffusion layer 204. As a result, it is difficult to reduce the side of the diode 200, thereby increasing the side of the ESD protection circuit.

In view of the problems of the conventional semiconductor element described above, a subject of the present invention is to provide a semiconductor element and a semiconductor device capable of reducing a size thereof while maintaining the allowable electrical current at a high level.

Further objects and advantages of the invention will be apparent from the following description of the invention.

SUMMARY OF THE INVENTION

In order to attain the objects described above, according to a first aspect of the present invention, a semiconductor element includes a substrate; a plurality of first regions formed in the substrate; and a second region formed in the substrate. Each of the first regions is formed in a regular hexagonal shape or an elongated hexagonal shape elongated in a specific direction. Further, each of the first regions contains an impurity with a first conductive type.

According to the first aspect of the present invention, the second region is formed in a plurality of frame shapes surrounding each of the first regions with an equal distance in between. The frame shapes are arranged adjacent to each other along sides thereof. Further, the second region contains an impurity with a second conductive type different from the first conductive type.

According to a second aspect of the present invention, a semiconductor element includes a substrate; a first region formed in the substrate; and a second region formed in the substrate. The first region is formed in a spiral shape, and contains an impurity with a first conductive type. The second region is arranged along the first region and is separated from the first region with a specific distance in between. Further, the second region contains an impurity with a second conductive type different from the first conductive type.

According to a third aspect of the present invention, a semiconductor device includes a circuitry region and the semiconductor element in the first aspect or the second aspect. The circuitry region is formed of a circuitry element and has a specific function. The first region is connected to the circuitry element through a first wiring portion. The second region is connected to ground through a second wiring portion, so that the semiconductor element functions as a static electricity protection element.

According to the present invention, it is possible to provide the semiconductor element and the semiconductor device capable of reducing a size thereof while maintaining the allowable electrical current at a high level.

BRIEF DESCRIPTION OF THE DRAWINGS

FIGS. 1(a) and 1(b) are schematic views showing a configuration of a semiconductor element according to a first embodiment of the present invention, wherein

FIGS. 2(a) and 2(b) are schematic views showing a configuration of a semiconductor element according to a second embodiment of the present invention, wherein

FIGS. 6(a) and 6(b) are schematic views showing a configuration of a conventional semiconductor element, wherein

DETAILED DESCRIPTION OF PREFERRED EMBODIMENTS

Hereunder, preferred embodiments of the present invention will be explained with reference to the accompanying drawings.

In the following description, the present invention is applied to a diode as a semiconductor element, in which an anode formed on a P-type substrate is a P-type, and a cathode formed on the P-type substrate is an N-type. Alternatively, the present invention may be applied to a diode as a semiconductor element, in which an anode formed on an N-type substrate is an N-type, and a cathode formed on the N-type substrate is a P-type.

First Embodiment

Figure 1:
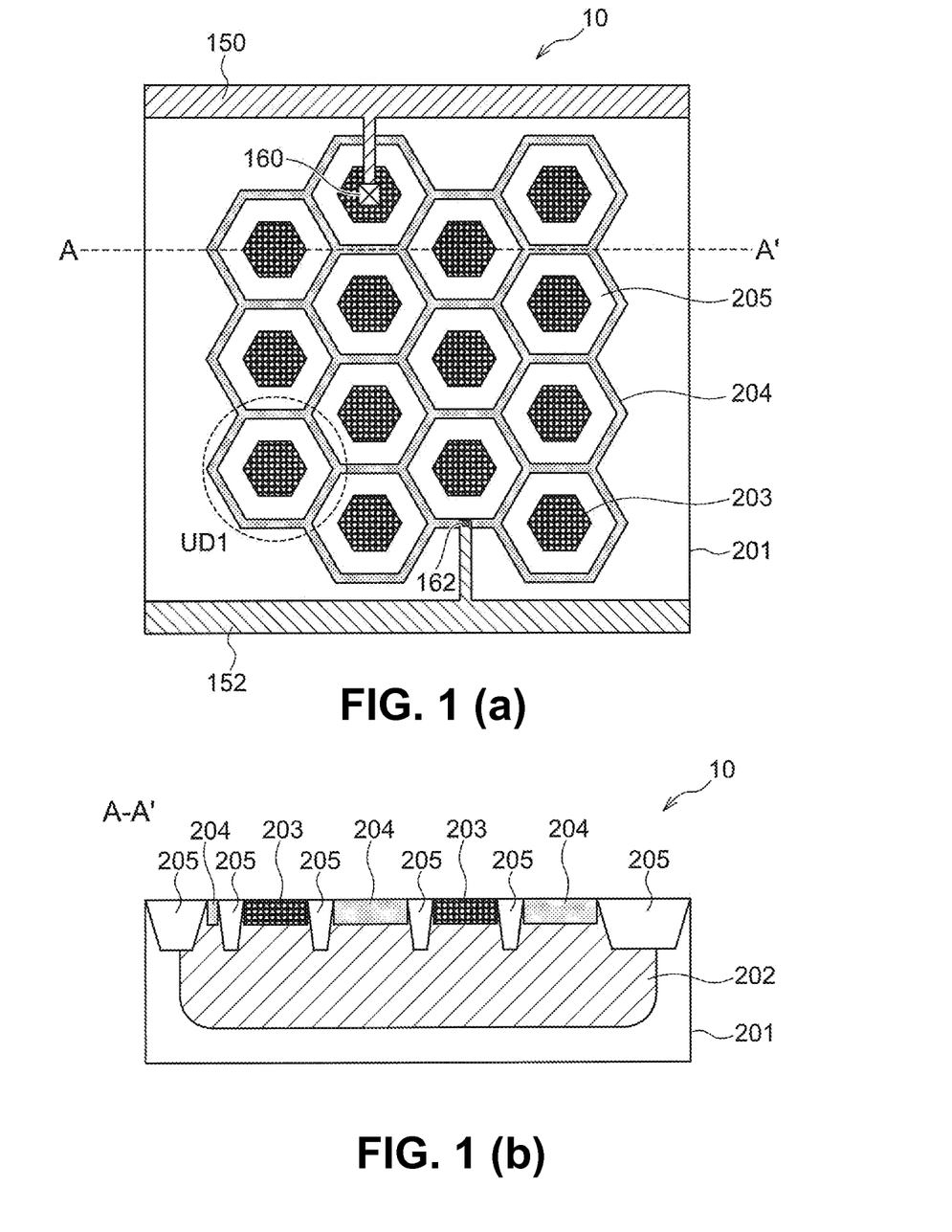
FIG. 1(a) is a schematic plan view showing the semiconductor element.
FIG. 1(b) is a schematic sectional view showing the semiconductor element taken along a line A-A' in FIG. 1(a)

A first embodiment of the present invention will be explained. FIGS. 1(a) and 1(b) are schematic views showing a configuration of a diode 10 as a semiconductor element according to the first embodiment of the present invention. More specifically, FIG. 1(a) is a schematic plan view showing the diode 10 as the semiconductor element, and FIG. 1(b) is a schematic sectional view showing the diode 10 as the semiconductor element taken along a line A-A' in FIG. 1(a).

As shown in FIG. 1(a), the diode 10 includes a P-type substrate 201; a plurality of P-type high concentration diffusion layers 203 formed in the substrate; and an N-type high concentration diffusion layer 204 formed in the substrate. Each of the P-type high concentration diffusion layers 203 and a part of the N-type high concentration diffusion layer 204 surrounding each of the P-type high concentration diffusion layers 203 constitute a unit element UD1 arranged adjacent to each other at a plurality of locations (fourteen in the first embodiment). Further, each of the P-type high concentration diffusion layers 203 is formed in a hexagonal shape in a plan view, and the N-type high concentration diffusion layer 204 is formed in a hexagonal frame shape. Accordingly, each of the P-type high concentration diffusion layers 203 is separated from each other, and the N-type high concentration diffusion layer 204 is integrally continuous.

As shown in FIG. 1(b), the diode 10 includes an N-type well 202 formed in the P-type substrate 201; the P-type high concentration diffusion layers 203 formed in the N-type well 202; and the N-type high concentration diffusion layer 204 formed in the N-type well 202. Further, element separation oxide films 205 are disposed between the P-type high concentration diffusion layers 203 and the N-type high concentration diffusion layer 204, so that the P-type high concentration diffusion layers 203 and the N-type high concentration diffusion layer 204 are separated.

In the first embodiment, a boundary between the P-type high concentration diffusion layer 203 and the N-type well 202 of the diode 10 constitutes a P-N connection to function as a diode. Further, the N-type high concentration diffusion layer 204 functions as a contact layer when a cathode wiring portion is connected to the N-type high concentration diffusion layer 204, and the P-type high concentration diffusion layers 203 function as a contact layer when an anode wiring portion is connected to the P-type high concentration diffusion layers 203.

In the first embodiment, the unit elements UD1 having the hexagonal shape are arranged in a so-called beehive honeycomb shape. Accordingly, the circumferential length of the diode 10 is equal to a sum of the circumferential length of each of the unit elements UD1. As described in the section "BACKGROUND OF THE INVENTION AND RELATED ART STATEMENT", the circumferential length of each of the unit elements UD1 is equal to the circumferential length of each of the P-type high concentration diffusion layers 203. Accordingly, the circumferential length of the diode 10 is equal to 14 times of the circumferential length of each of the unit elements UD1.

As a result, as compared with the conventional semiconductor element having the rectangular shape as shown in FIGS. 6(a) and 6(b), it is possible to increase the circumferential length per unit area of the circuitry arrangement region (described in more detail later). Accordingly, it is possible to increase the allowable electrical current per unit area of the circuitry arrangement region. Consequently, it is possible to reduce the size of the semiconductor element and the size of the static electricity protection element.

In the first embodiment, it is preferred that the diode 10 includes the unit elements UD1 having a shape similar to a substantially regular hexagonal shape as much as possible. It should be noted that it is suffice that the unit elements UD1 can be arranged with sides of the hexagonal shape adjacent to each other. Accordingly, the present invention is not limited to the unit elements UD1 having a substantially regular hexagonal shape, and the unit elements UD1 may have an elongated hexagonal shape elongated in a specific direction (for example, a direction connecting between opposite vertexes of the regular hexagonal shape).

Further, in the first embodiment, the diode 10 includes fourteen of the unit elements UD1. It should be noted that the present invention is not limited to the unit elements UD1 arranged at the fourteen locations, and the unit elements UD1 may be arranged at an arbitrary number of locations according to an actual design restriction.

In the first embodiment, the diode 10 may be applied to the static electricity protection element ESD1 or the static electricity protection element ESD2 of the semiconductor integrated circuit 100 shown in FIG. 5, thereby constituting the ESD protection circuit as the semiconductor device.

A method of producing the diode 10 will be explained next. It should be noted that the diode 10 may be produced with a ordinary semiconductor manufacturing process. In the following description, as an example of the method of producing the diode 10, a shallow trench isolation (STI) method using a P-type silicon substrate will be explained.

In the first step, a main surface of the P-type silicon substrate is masked with photo resist using photo-lithography. In the next step, an N-type impurity is diffused through an ion implantation method and the like to form the N-type well 202. In the next step, a thermal oxidation process is applied to a wafer, so that a $SiO_2$ film (a silicon oxide film) is formed. After the $SiO_2$ film is formed, a SiN film (a silicon nitride film) is formed on the $SiO_2$ film through a chemical vapor deposition (CVD) process and the like.

In the next step, a photo resist is applied to a whole surface of the wafer, and the photo resist is exposed and developed to form a resist pattern. In the next step, the SiN film and the $SiO_2$ film are etched with the resist pattern as a mask. Accordingly, a trench (a groove) corresponding to each of the element separation oxide films 205 is formed.

In the next step, the $SiO_2$ film is formed on a whole surface of the wafer through the chemical vapor deposition (CVD) process and the like while the trench is being filled. In the next step, the $SiO_2$ film except a portion thereof in the trench is ground off through a chemical mechanical polishing (CMP) process and the like.

In the next step, the surface of the wafer is masked with the photo resist using photo-lithography. In the next step, a P-type impurity is diffused through the ion implantation method and the like to form the P-type high concentration diffusion layer 203. In the next step, the surface of the wafer is masked with the photo resist using photo-lithography. In the next step, the N-type impurity is diffused through the ion implantation method and the like to form the N-type high concentration diffusion layer 204. It should be noted that the P-type high concentration diffusion layer 203 and the N-type high concentration diffusion layer 204 may be formed in the reverse order.

In the next step, an interlayer insulation file formed of SiO2 and the like is formed on a whole surface of the wafer using the CVD and the like. In the next step, a contact hole is formed to penetrate through the interlayer insulation film, so that the contact holes reach the P-type high concentration diffusion layers 203 and the N-type high concentration diffusion layer 204.

In the first embodiment, it should be noted that it is necessary to form the contact hole corresponding to the P-type high concentration diffusion layer 203 relative to each of the unit elements UD1. On the other hand, it is necessary to form only one or a plurality of contact holes corresponding to the N-type high concentration diffusion layer 204 at an arbitrary location of the N-type high concentration diffusion layer 204 formed in the continuous pattern.

In the next step, a conductive member formed of a material such as tungsten (W) and the like is filled in each of the contact holes to form contacts. In the next step, a metal wiring layer formed of aluminum (Al) and the like on the interlayer insulation film, so that the metal wiring layer is connected to the contact.

As shown in FIG. 1(a), a first wiring portion 150 is connected to one of the P-type high concentration diffusion layers 203 through a contact 160, and a second wiring portion 152 is connected to the N-type high concentration diffusion layer 204 through a contact 162. It should be noted that the first wiring portion 150 and the second wiring portion 152 may be situated in a same wiring layer of a multilayer wiring portion. Alternatively, the first wiring portion 150 and the second wiring portion 152 may be situated in different wiring layers of the multilayer wiring portion.

In the first embodiment, the first wiring portion 150 and the second wiring portion 152 are provided for connecting an internal circuit of the diode 10 such as one inside the semiconductor integrated circuit 100 shown in FIG. 5. For example, when the diode 10 is disposed as the static electricity protection element ESD1, the first wiring portion 150 may be connected to the input terminal PAD, and the second wiring portion 152 may be connected to the positive power source VDD. Further, when the diode 10 is disposed as the static electricity protection element ESD2, the first wiring portion 150 may be connected to the ground GND, and the second wiring portion 152 may be connected to the input terminal PAD.

In the first embodiment, each of the P-type high concentration diffusion layers 203 is connected to the contact per unit element UD1 (not shown in FIG. 1(a)), and each of the contacts is collectively connected to the first wiring portion 150. On the other hand, the N-type high concentration diffusion layer 204 is formed in the continuous pattern. Accordingly, the N-type high concentration diffusion layer 204 is connected to at least one contact, so that the N-type high concentration diffusion layer 204 is connected to the second wiring portion 152.

Through the process described above, the semiconductor device using the diode 10 as the semiconductor element is constituted. In the first embodiment, the element separation oxide films 205 are formed through the STI method. The present invention is not limited thereto, and the element separation oxide films 205 may be formed through, for example, a local oxidization of silicon (LOCOS) method.

Second Embodiment

Figure 2:
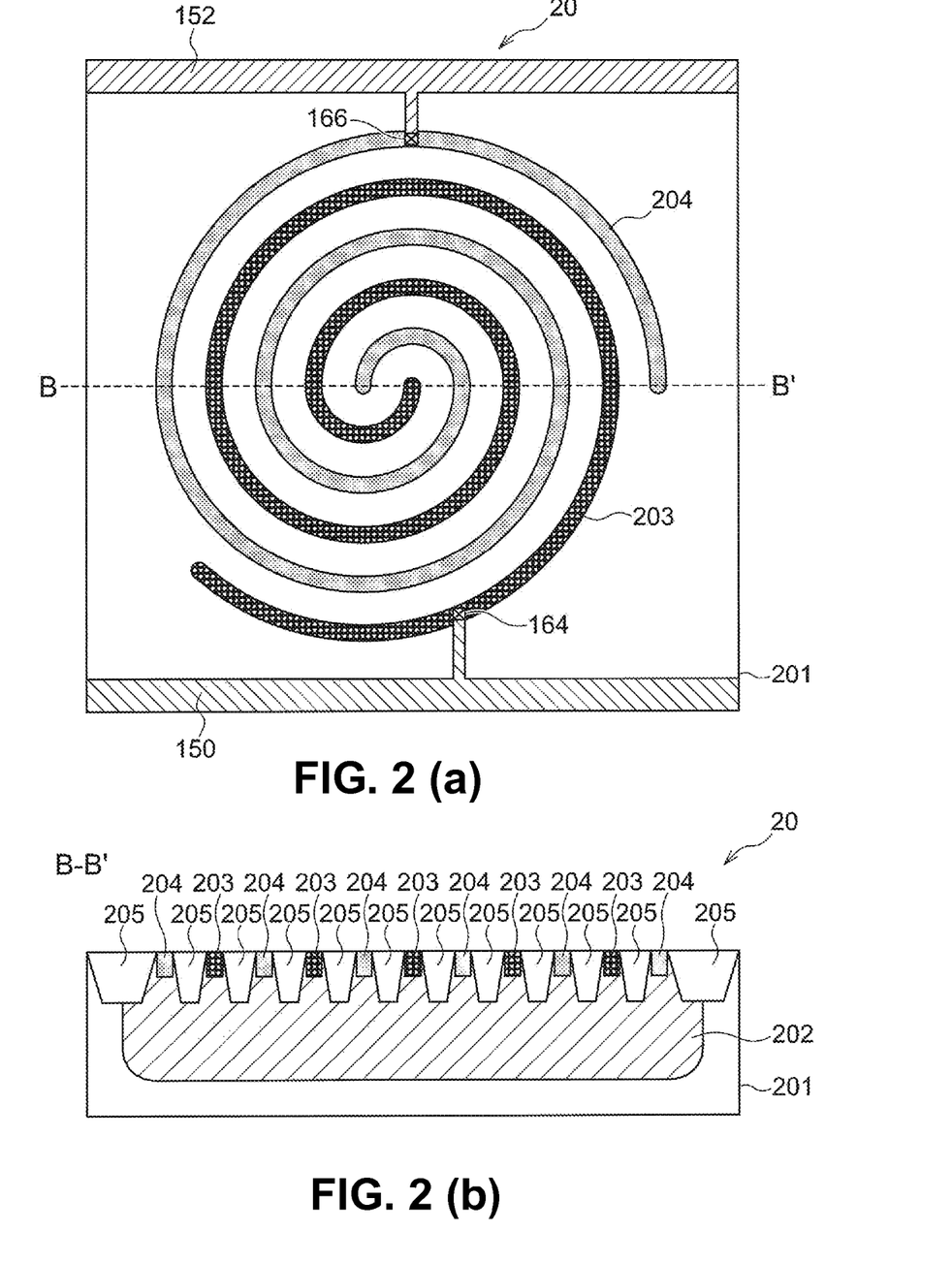
FIG. 2(a) is a schematic plan view showing the semiconductor element.
FIG. 2(b) is a schematic sectional view showing the semiconductor element taken along a line B-B' in FIG. 2(a)

A second embodiment of the present invention will be explained with reference to FIGS. 2(a) and 2(b). FIGS. 2(a) and 2(b) are schematic views showing a configuration of a diode 20 as a semiconductor element according to a second embodiment of the present invention. More specifically, FIG. 2(a) is a schematic plan view showing the diode 20 as the semiconductor element, and FIG. 2(b) is a schematic sectional view showing the diode 20 as the semiconductor element taken along a line B-B' in FIG. 2(a).

In the second embodiment, the diode 20 includes the P-type high concentration diffusion layer 203 and the N-type high concentration diffusion layer 204 having shapes different from those of the P-type high concentration diffusion layer 203 and the N-type high concentration diffusion layer 204 of the diode 10 in the first embodiment. Components in the second embodiment similar to those in the first embodiment are designated with the same reference numerals, and explanations thereof are omitted.

As shown FIG. 2(a), each of the P-type high concentration diffusion layer 203 and the N-type high concentration diffusion layer 204 of the diode 20 is formed in one single continuous spiral shape (swirl shape). More specifically, different from the diode 10, the P-type high concentration diffusion layer 203 of the diode 20 is not separated in the island shape, but the integrated single shape.

In the second embodiment, each of the P-type high concentration diffusion layer 203 and the N-type high concentration diffusion layer 204 of the diode 20 is formed in a half circular shape with a diameter thereof gradually increasing. Further, the P-type high concentration diffusion layer 203 and the N-type high concentration diffusion layer 204 are arranged to away from each other with an equal interval. It should be noted that the present invention is not limited to this configuration. For example, each of the P-type high concentration diffusion layer 203 and the N-type high concentration diffusion layer 204 of the diode 20 may be formed in a quarter circular shape with a diameter thereof gradually increasing. Further, each of the P-type high concentration diffusion layer 203 and the N-type high concentration diffusion layer 204 of the diode 20 may be formed in a part of an oval shape with an unequal interval.

In the second embodiment, it is preferred that each of the P-type high concentration diffusion layer 203 and the N-type high concentration diffusion layer 204 of the diode 20 is formed in the similar spiral shape (a similar shape) in consideration of uniformity of a diode characteristic. It should be noted that the present invention is not limited to this configuration. As shown in FIG. 2(a), the P-type high concentration diffusion layer 203 and the N-type high concentration diffusion layer 204 may be formed in different shapes having different lengths in consideration of connection to a wiring portion. In the configuration shown in FIG. 2(a), the outermost portion of the P-type high concentration diffusion layer 203 has a length greater than that of the N-type high concentration diffusion layer 204.

As shown in FIG. 2(b), the diode 20 has a configuration in the sectional view similar to that of the diode 10 in the first embodiment. More specifically, the diode 20 includes the N-type well 202 formed in the P-type substrate 201, and the P-type high concentration diffusion layer 203 and the N-type high concentration diffusion layer 204 formed in the N-type well 202. Further, the element separation oxide film 205 is disposed between the P-type high concentration diffusion layer 203 and the N-type high concentration diffusion layer 204, so that the P-type high concentration diffusion layer 203 and the N-type high concentration diffusion layer 204 are separated.

In the second embodiment, similar to the first embodiment, a boundary between the P-type high concentration diffusion layer 203 and the N-type well 202 of the diode 20 constitutes a P-N connection to function as a diode. Further, the N-type high concentration diffusion layer 204 functions as a contact layer when a cathode wiring portion is connected to the N-type high concentration diffusion layer 204, and the P-type high concentration diffusion layer 203 functions as a contact layer when an anode wiring portion is connected to the P-type high concentration diffusion layer 203.

As described above, in the second embodiment, the P-type high concentration diffusion layer 203 and the N-type high concentration diffusion layer 204 are formed in the spiral shape and arranged closely with each other. Accordingly, as compared to the conventional semiconductor element having the rectangular shape shown in FIG. 6(a), it is possible to increase the circumferential length of the diode 20 per unit area of the circuitry arrangement region. Accordingly, it is possible to increase the allowable electrical current per unit area of the circuitry arrangement region. Consequently, it is possible to reduce the size of the semiconductor element and the size of the static electricity protection element.

In the second embodiment, the diode 20 may be applied to the static electricity protection element ESD1 or the static electricity protection element ESD2 of the semiconductor integrated circuit 100 shown in FIG. 5, thereby constituting the ESD protection circuit as the semiconductor device.

In the second embodiment, it should be noted that the diode 20 may be produced through a process similar to that of the diode 10 in the first embodiment. As shown in FIG. 2(a), the first wiring portion 150 is connected to the P-type high concentration diffusion layer 203 through a contact 164, and the second wiring portion 152 is connected to the N-type high concentration diffusion layer 204 through a contact 166.

In the second embodiment, the contact 164 may be disposed in the P-type high concentration diffusion layer 203 at one location or a plurality of locations for connecting the P-type high concentration diffusion layer 203 to the first wiring portion 150. Further, the contact 166 may be disposed in the N-type high concentration diffusion layer 204 at one location or a plurality of locations for connecting the N-type high concentration diffusion layer 204 to the second wiring portion 152. In the configuration shown in FIG. 2(a), the contact 164 is disposed in the P-type high concentration diffusion layer 203 at one location, and the contact 166 is disposed in the N-type high concentration diffusion layer 204 at one location.

A comparison analysis of the circumferential length of the diode 10 and the diode 20 and that of the comparative example will be discussed next with reference to FIGS. 3(a)-3(c) and FIGS. 4(a)-4(b).

Figure 3:
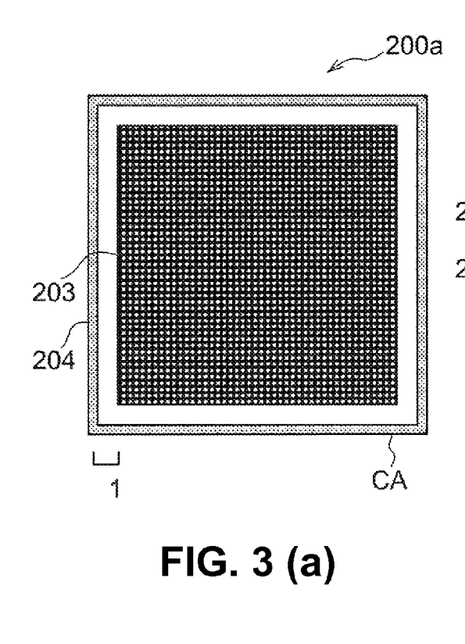
FIGS. 3(a) to 3(c) are schematic plan views showing configurations of semiconductor elements according to comparative examples.

FIGS. 3(a) to 3(c) are schematic plan views showing configurations of semiconductor elements according to comparative examples. As shown in FIGS. 3(a) to 3(c), the semiconductor elements according to the comparative examples include the P-type high concentration diffusion layer 203 having a rectangular shape and arranged in three different patterns in a plan view.

FIG. 4(a) is a schematic plan view showing the configuration of the diode 10 as the semiconductor element according to the first embodiment of the present invention. FIG. 4(b) is a schematic plan view showing the configuration of the diode 20 as the semiconductor element according to the second embodiment of the present invention. In FIGS. 4(a) and 4(b), the circumferential lengths of the diode 10 and the diode 20 are calculated with the conditions similar to those for calculating the circumferential lengths of the semiconductor elements according to the comparative examples.

More specifically, in the semiconductor elements shown in FIGS. 3(a) to 3(c) and FIGS. 4(a) and 4(b), the circumferential length thereof is defined as the sum of the circumferential lengths of the P-type high concentration diffusion layers 203 opposing the N-type high concentration diffusion layer 204. Further, in the semiconductor elements shown in FIGS. 3(a) to 3(c) and FIGS. 4(a) and 4(b), it is assumed that the circuitry arrangement region (referred also to as a circuitry area CA) constituting the diode has a common shape and a common area, and the diodes having the different shapes are arranged in the circuitry area CA for calculating the circumferential lengths of the semiconductor elements.

In FIGS. 3(a) to 3(c) and FIGS. 4(a) and 4(b), a common unit length (designated with the number "1" in FIGS. 3(a) to 3(c) and FIGS. 4(a) and 4(b)) is presented as a scale for the measurement. In the configurations shown in FIGS. 3(a) to 3(c) and FIGS. 4(a) and 4(b), the element separation oxide film 205 having the unit length "1" is arranged around each of the P-type high concentration diffusion layers 203, and the N-type high concentration diffusion layer 204 is disposed on a boundary between the element separation oxide films 205 arranged adjacent to each other. IT should be noted that the circuitry area CA has a square shape having a size of 13×13 unit length in FIGS. 3(a) to 3(c) and FIGS. 4(a) and 4(b).

As shown in FIG. 3(a), a diode 200a includes the P-type high concentration diffusion layer 203 having a substantially square shape in the circuitry area CA having a square outer shape. Further, the N-type high concentration diffusion layer 204 having a square frame shape surrounds the P-type high concentration diffusion layer 203 in the circuitry area CA. It should be noted that the P-type high concentration diffusion layer 203 has one side having 11 unit length, and four sides of the P-type high concentration diffusion layer 203 opposite to the N-type high concentration diffusion layer 204. Accordingly, the circumferential length of the diode 200a is calculated to be 44 unit length (=11×4).

As shown in FIG. 3(b), a diode 200b includes unit elements UD2 arranged adjacent to each other at sixteen locations in the circuitry area CA having a square outer shape. In each of the unit elements UD2, the N-type high concentration diffusion layer 204 having a square frame shape surrounds the P-type high concentration diffusion layers 203 having a substantially square shape. It should be noted that each of the P-type high concentration diffusion layers 203 has one side having 1 unit length, and four sides of each of the P-type high concentration diffusion layers 203 opposite to the N-type high concentration diffusion layer 204. Accordingly, the circumferential length of the diode 200b is calculated to be 64 unit length (=1×4×16).

As shown in FIG. 3(c), a diode 200c includes unit elements UD4 arranged adjacent to each other at eight locations in having a square outer shape. In each of the unit elements UD2, the N-type high concentration diffusion layer 204 having a substantially square shape and the P-type high concentration diffusion layer 203 having a substantially square shape are paired. It should be noted that each of the P-type high concentration diffusion layers 203 has one side having 2 unit length, and each of the N-type high concentration diffusion layer 204 has one side having 2 unit length. Also, it should be noted that each of the P-type high concentration diffusion layers 203 has a different number of sides opposing to the N-type high concentration diffusion layer 204 (the P-type high concentration diffusion layers 203 are designated with 203a to 203h in FIG. 3(c) to differentiate). In FIG. 3(c), the sides of the P-type high concentration diffusion layers 203 that oppose to the N-type high concentration diffusion layer 204 are represented with broken lines.

As shown in FIG. 3(c), among the P-type high concentration diffusion layers 203, the P-type high concentration diffusion layer 203a has three sides opposing to the N-type high concentration diffusion layer 204; the P-type high concentration diffusion layer 203b has two sides opposing to the N-type high concentration diffusion layer 204; the P-type high concentration diffusion layer 203c has three sides opposing to the N-type high concentration diffusion layer 204; the P-type high concentration diffusion layer 203d has four sides opposing to the N-type high concentration diffusion layer 204; the P-type high concentration diffusion layer 203e has four sides opposing to the N-type high concentration diffusion layer 204; the P-type high concentration diffusion layer 203f has three sides opposing to the N-type high concentration diffusion layer 204; the P-type high concentration diffusion layer 203g has two sides opposing to the N-type high concentration diffusion layer 204; and the P-type high concentration diffusion layer 203h has three sides opposing to the N-type high concentration diffusion layer 204. Accordingly, the total number of the sides of the N-type high concentration diffusion layer 204 is equal to 24, and the circumferential length of the diode 200c is calculated to be 48 unit length (=2×24).

Next, the circumferential lengths of the diode 10 and the diode 20 will be explained with reference to FIGS. 4(a) and 4(b).

As shown in FIG. 4(a), the diode 10 in the first embodiment is placed in the circuitry area CA. It should be noted that one side of each of the P-type high concentration diffusion layers 203 having the hexagonal shape is equal to one unit length.

As shown in FIG. 4(a), the diode 10 includes twelve of the unit elements UD1, in which all six sides of the P-type high concentration diffusion layers 203 are opposite to the N-type high concentration diffusion layer 204. Further, the diode 10 includes the P-type high concentration diffusion layer 203i and the P-type high concentration diffusion layer 203j, whose hexagonal shape is only partially situated in the circuitry area CA, and five sides of each of the P-type high concentration diffusion layer 203*i* and the P-type high concentration diffusion layer 203*j* are opposite to the N-type high concentration diffusion layer 204. Accordingly, the circumferential length of the diode 10 is calculated to be 82 unit length (=6×12+5×2).

Figure 4:
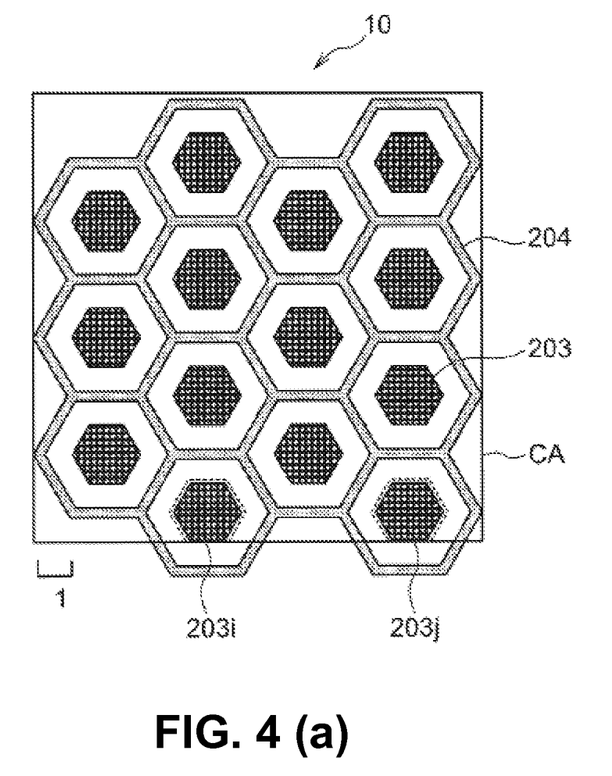
FIG. 4(a) is a schematic plan view showing the configuration of the semiconductor element according to the first embodiment of the present invention.
FIG. 4(b) is a schematic plan view showing the configuration of the semiconductor element according to the second embodiment of the present invention.

As shown in FIG. 4(*b*), the diode 20 in the second embodiment is placed in the circuitry area CA. It should be noted that the P-type high concentration diffusion layer 203 having the spiral shape has three circular portions. More specifically, the P-type high concentration diffusion layer 203 has one half circular portion having one unit length radius, and twelve quarter circular portions are continued. A radius of the twelve quarter circular portions increases by a half unit length. Accordingly, the circumferential length of the diode 20 is calculated to be 71 unit length (=2×n×(1+1.5+2+2.5+3+3.5+4+4.5+5+5.5+6+6.5))/4.

As described above, in the first embodiment and the second embodiment, as compared with the conventional semiconductor element according to the comparative examples, it is possible to increase the circumferential length of the diode 10 and the diode 20.

In the first embodiment and the second embodiment, the present invention is applied to the diode 10 and the diode 20 as the semiconductor elements, in which the anode is the P-type and the cathode is the N-type. The present invention is not limited thereto, and the present invention may be applied to a semiconductor element, in which the anode is the N-type and the cathode is the P-type. In this case, the conductive type in the diode 10 and the diode 20 in the first embodiment and the second embodiment is reversed.

The disclosure of Japanese Patent Application No. 2014-157588, filed on Aug. 1, 2014, is incorporated in the application by reference.

While the invention has been explained with reference to the specific embodiments of the invention, the explanation is illustrative and the invention is limited only by the appended claims.

What is claimed is:

1. A semiconductor element, comprising:
a substrate;
a plurality of first regions formed in the substrate;
a second region formed in the substrate; and
an insulation member disposed between the first regions and the second region,
wherein each of said first regions is formed in a regular hexagonal shape or an elongated hexagonal shape elongated in a specific direction,
each of said first regions contains a first impurity with a first conductive type,
said second region is formed in a plurality of frame shapes surrounding each of the first regions with an equal distance in between,
said frame shapes are arranged adjacent each other along sides thereof, and
said second region contains a second impurity with a second conductive type different from the first conductive type.

2. The semiconductor element according to claim 1, further comprising a third region formed in the substrate and containing the second impurity,
wherein said substrate contains the first impurity, and
said first regions and said second region are formed in the third region.

3. A semiconductor device comprising:
a circuitry region; and
a semiconductor element,
wherein said semiconductor element comprises:
a substrate;
a plurality of first regions formed in the substrate; and
a second region formed in the substrate,
each of said first regions is formed in a regular hexagonal shape or an elongated hexagonal shape elongated in a specific direction,
each of said first regions contains a first impurity with a first conductive type,
said second region is formed in a plurality of frame shapes surrounding each of the first regions with an equal distance in between,
said frame shapes are arranged adjacent each other along sides thereof,
said second region contains a second impurity with a second conductive type different from the first conductive type,
said circuitry region is formed of a circuitry element and has a specific function,
each of said first regions is connected to the circuitry element through a first wiring portion, and
said second region is connected to ground through a second wiring portion so that the semiconductor element functions as a static electricity protection element.

4. A semiconductor element, comprising:
a substrate;
a diode having a first region and a second region; and
an insulation member disposed between the first region and the second region,
wherein said first region is formed in a hexagonal shape,
said first region contains a first impurity with a first conductive type,
said second region is formed in a frame shape surrounding the first region with a constant distance in between, and
said second region contains a second impurity with a second conductive type different from the first conductive type.

5. The semiconductor element according to claim 4, further comprising a first wiring portion electrically connected to the first region; and
a second wiring portion electrically connected to the second region.

6. An electro-static discharge protection circuit comprising the semiconductor element according to claim 4.

7. A semiconductor device, comprising:
a substrate;
a diode having a first region and a second region;
an interlayer insulation film covering the diode and having a first contact and a second contact;
a first wiring portion connected to the first region through the first contact; and
a second wiring portion connected to the second region through the second contact,
wherein said first region is formed in a hexagonal shape,
said first region contains a first impurity with a first conductive type,
said second region is formed in a frame shape surrounding the first region with a constant distance in between, and
said second region contains a second impurity with a second conductive type different from the first conductive type.

8. The semiconductor element according to claim 7, wherein said first wiring portion is connected to a first potential, and said second wiring portion is connected to a second potential different from the first potential.

* * * * *